United States Patent [19]
Chow et al.

[11] Patent Number: 5,815,042
[45] Date of Patent: Sep. 29, 1998

[54] DUTY CYCLED CONTROL IMPLEMENTED WITHIN A FREQUENCY SYNTHESIZER

[75] Inventors: Hugh Chow, Thornhill; David Glen, North York; Ray Chau, Toronto, all of Canada

[73] Assignee: ATI Technologies Inc., Ontario, Canada

[21] Appl. No.: 634,399

[22] Filed: Apr. 18, 1996

[30] Foreign Application Priority Data

Oct. 3, 1995 [CA] Canada ................................. 2159762

[51] Int. Cl.⁶ ........................................... H03B 1/00
[52] U.S. Cl. ........................... 331/57; 331/34; 331/74; 331/75; 331/177 R
[58] Field of Search .................. 331/177 R, 57, 331/34, 74, 75

[56] References Cited

U.S. PATENT DOCUMENTS

| | | | |
|---|---|---|---|
| 5,028,888 | 7/1991 | Ray | 331/57 |
| 5,233,314 | 8/1993 | McDermott et al. | 331/17 |
| 5,399,995 | 3/1995 | Kardontchik et al. | 331/17 |
| 5,483,205 | 1/1996 | Kawamura | 331/74 |

*Primary Examiner*—Toan Tran
*Assistant Examiner*—An T. Luu
*Attorney, Agent, or Firm*—E. E. Pascal; R. A. Wilkes; H. C. Baker

[57] ABSTRACT

A programmable frequency synthesizer comprised of a phase locked loop (PLL) including a current controlled oscillator (ICO), a level translator for receiving output signals from the ICO wherein the output signals have a finite slew rate, a reference source of signals, a phase-frequency detector for receiving signals from the reference source and output signals generated by the level translator and for providing pulse signals to the ICO having pulse widths which are directly proportional to phase difference between the signals from the reference source and the output signals from the level translator, and apparatus for varying the slew rate of the output signals from the ICO wherein the duty cycle and thus the frequency of output signals of the level translator may be varied.

15 Claims, 3 Drawing Sheets

DUTY CYCLED CONTROL IMPLEMENTED WITHIN A FREQUENCY SYNTHESIZER

FIELD OF THE INVENTION

This invention relates to clock generation circuitry and in particular to a frequency synthesizer the duty cycle of which can be controlled for more than one frequency.

BACKGROUND TO THE INVENTION

Modern high speed video graphics display circuitry utilize pipelining technology which use both the rising and falling edges of an input clock signal in order to achieve short pipeline delay, high operating frequency and low power dissipation within a given semiconductor fabricating process. Digital logic circuits along the pipeline make use of time elapsed between the rising and falling edges to manipulate data.

For two digital logic circuits with propagation delays td1 and td2 to operate properly within high and low logic level pulse intervals respectively, the duty cycle of the clock must be exactly (td1(td1+td2)), or else the clock signal has to run at a lower frequency since any other value of duty cycle requires either a longer high pulse width or longer low pulse width, and in turn, a longer cycling period, to maintain proper functionality within the two particular logic circuits.

Further, to perform a maximum number of logic operations within a certain period of time, a high performance video graphics display system requires more than one synthesized clock to run at different clocking frequencies with different duty cycles at which all the digital logic circuits are operating properly, and so that no part of any clock cycle is wasted.

The duty cycle of the clock signal of a frequency doubler has been successfully controlled, but a frequency doubler is incapable of synthesizing more than one frequency from a given reference frequency. The frequency doubler also must operate at a relatively low frequency.

Digital circuits have also been employed to achieve duty cycle control at the output of a frequency synthesizer, but programming range has been inadequate because of the relatively higher slew rate at digital logic circuit outputs.

BACKGROUND TO THE INVENTION

The present invention is a frequency synthesizer which generates different output frequencies from a single source of reference frequency, wherein the output duty cycles are programmable. The invention has provided programmable duty cycle clock signals at a very high frequency of 200 MHz. The invention is thus suited for use in the aforenoted video graphic display circuitry.

In accordance with an embodiment of the invention, a programmable frequency synthesizer is comprised of a phase locked loop (PLL) including a current control oscillator (ICO) which generates a digital clock signal, the frequency of which is controlled by input current to the ICO, a level translator which has a finite output slew rate for translating reduced swing output signals from the ICO into fully digital signals, an output buffer for buffering the output of the level translator, a reference source of clock signals, a phase-frequency detector (PFD) for receiving output signals from the reference source and the output from the output buffer and for generating voltage pulse signals having pulse widths which are directly proportional to phase difference between the signals from the reference source and the output signals from the output of the output buffer, a charge pump for converting output voltage pulses from the PFD into output current pulses, a loop filter for converting output current pulses from the charge pump into a bias voltage and for providing the PLL with high order damping, a voltage to current converter for mapping the output bias voltage from the loop filter into bias current applied to the ICO for control thereof, and apparatus for varying the slew rate of the output signals from the level translator wherein the duty cycle of the output signals may be varied. The output buffer may be included as part of the level translator which may be, in turn, included as part of the ICO.

In accordance with another embodiment of the invention, a programmable frequency synthesizer is comprised of a phase locked loop (PLL) including a current controlled oscillator (ICO) which has an internal signal with a finite slew rate, a reference source of clock signals, a phase-frequency detector (PFD) for receiving output signals from the reference source and the output from the ICO and for generating voltage pulse signals having pulse widths which are directly proportional to phase difference between the signals form the reference source and the output signals from the output from the ICO, a charge pump for converting output voltage pulses from the PFD into output current pulses, a loop filter for converting output current pulses from the charge pump into a bias voltage and for providing the PLL with high order damping, a voltage to current converter for mapping the output bias voltage from the loop filter into bias current that controls the ICO, and apparatus for varying the slew rate of a signal within the ICO wherein the duty-cycle of the output signals may be varied. The voltage to current converter may combine with the ICO and become a voltage controlled oscillator (VCO).

In accordance with another embodiment of the invention, a programmable frequency synthesizer is comprised of a phase locked loop (PLL) including a voltage controlled oscillator (VCO) which has an internal signal with a finite output slew rate, a reference source of clock signals, a phase-frequency detector (PFD) for receiving output signals from the reference source and the output from the VCO and for generating voltage pulse signals having pulse widths which are directly proportional to phase difference between the signals from the reference source and the output signals from the output from the VCO, a charge pump for converting output voltage pulses from the PFD into output current pulses, a loop filter for converting output current pulses from the charge pump into a bias voltage and for providing the PLL with high order damping, a voltage to current converter for mapping the output bias voltage from the loop filter into bias current that controls the ICO, and apparatus for varying the slew rate of a signal within the VCO wherein the duty-cycle of the output signals may be varied.

In accordance with an embodiment of the invention, a programmable frequency synthesizer is comprised of a phase locked loop (PLL) including a current controlled oscillator (ICO), a level translator for receiving output signals from the ICO wherein the output signals have a finite slew rate, a reference source of signals, a phase-frequency detector for receiving signals from the reference source and output signals generated by the level translator and for providing pulse signals to the ICO having pulse widths which are directly proportional to phase difference between the signals from the reference source and the output signals from the level translator, and apparatus for varying the slew rate of the output signals from the phase-frequency detector wherein the duty cycle of the output signals may be varied.

In accordance with another embodiment, a programmable frequency synthesizer is comprised of a phase locked loop (PLL) including a current controlled oscillator (ICO), a reference source of signals, a phase-frequency detector for receiving signals from the reference source and feedback signals from an output of the phase locked loop derived from the output of the ICO and for providing signals to the ICO having pulse widths which are directly proportional to phase difference between the signals from the reference source and the feedback signals, and apparatus for varying the slew rate of output signals from the ICO wherein the duty cycle of the output signals may be varied.

In accordance with another embodiment, a method of synthesizing a signal is comprised of providing a phase locked loop having a controlled oscillator (CO), and selectively varying the slew rate of an output signal derived from CO within the loop or within the CO to thereby vary the duty cycle thereof.

In accordance with another embodiment, a method of synthesizing a signal is comprised of synthesizing a pulse signal within a phase locked loop and selectively varying the slew rate of the signal within the phase locked loop to vary the duty cycle of the signal.

BRIEF INTRODUCTION TO THE DRAWINGS

A better understanding of the invention will be obtained by reading the description of the invention below, with reference to the following drawings, in which:

FIG. 1 is a block diagram of a frequency synthesizer system in accordance with the present invention, FIG. 2 is a schematic diagram of a current controlled oscillator which can be used in the present invention, FIG. 3 is a block diagram of a level translator which does not provide duty cycle control, FIG. 4 is a signal timing chart used to illustrate operation of the present invention, and FIG. 5 is a block diagram of an improved level translator that can be programmed and used in the present invention.

DETAILED DESCRIPTION OF THE INVENTION

Figure 1:
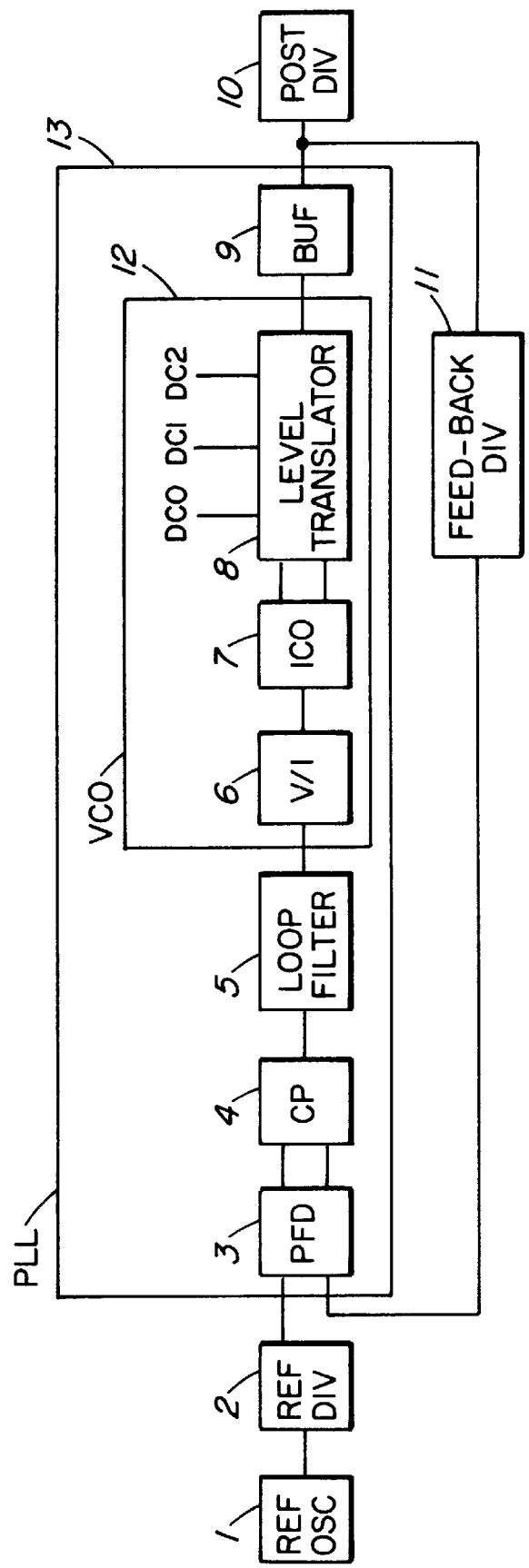

In accordance with an embodiment of the invention, FIG. 1 illustrates a frequency synthesizer, which includes a phase-locked loop (PLL) 13. A reference oscillator 1 has its output signal divided down by reference divider 2, the output signal of which is applied to one of the pairs of inputs of a phase-frequency detector 3 of a phase-locked loop. The output of the detector 3 is applied to a charge pump 4. The output signal of the charge pump 4 is applied through a loop filter 5 to a voltage to current converter 6 of a voltage controlled oscillator (VCO) 12. In a successful laboratory prototype, the loop filter was a second order RC filter accompanied by a third order capacitor. The loop filter converts the input current pulses into an output bias voltage with high order damping. However other filters could be used.

The output clock signal of the VCO is applied to an output buffer 9. A feedback frequency divider 11 divides the output signal from the PLL and applies it to another one of the inputs of a frequency-phase detector 3. The output of the buffer 9 also provides the output signal of the PLL, and is typically applied to the input of a post frequency divider 10. However other forms of PLL and VCO could be used.

In accordance with an embodiment of the present invention, a level translator which is programmable by receiving program bits at inputs DC0, DC1 and DC2, for example, selectively controls the slew rate of its output, and thus the duty cycle of the signal synthesized by the PLL, in a manner as will be described below.

The output pulses of the phase-frequency detector 3 have widths directly proportional to the phase difference between the reference clock signal and the fed-back signal from the output of the PLL 13. The charge pump 4 sources or drains electronic charge to or from its output in an amount which is determined by the width of the input pulses from the phase-frequency detector 3. The loop filter 5 converts electronic charge from the charge pump into voltage level with high order damping. The voltage controlled oscillator (VCO) 12 outputs a digital clock signal of which the frequency is determined by the input voltage level to it. Buffer 9 is a high speed digital clock buffer which buffers the output signal of the VCO.

The VCO includes a voltage to current converter 6 which sources a constant current into its output in accordance with the input voltage level. Current controlled oscillator 7 receives the output signal of converter 6 and outputs a pair of reduced amplitude swing differential clock signals of which the frequencies are determined by the input current magnitude. Level translator 8 receives the output signal of the current controlled oscillator and converts the reduced swing differential output signals and converts them to a fully digital output clock signal with the same frequency.

During frequency synthesizing, the clock frequency at the output of the frequency synthesizer is determined by the reference frequency oscillator and the dividing ratios of the reference frequency divider 2, the feedback divider 11, and the post divider 10. For any fixed combination of the dividing ratios of these dividers, and a fixed reference frequencies, the PLL in accordance with the prior art will output a clock signal of which the frequency is invariant in the time domain. In that case, the VCO 12 takes a constant input voltage level and generates a clock of which the frequency is invariant in the time domain.

In the design described above, with a reference oscillator 1 with frequency fi, a reference divider 2 of frequency dividing ratio of M, a feed-back divider 11 of frequency dividing ratio of N, and a post divider 10 of frequency dividing ratio of P, a synthesized clock signal of-frequency given by fo=(fi×N)/(M×P) will present at the output of the post divider 10.

Other forms of frequency synthesizer may alternatively be used.

It will be noted that the phase-frequency detector has two inputs, a reference input and a feed-back input, and two outputs, up and down. When clock signals at the reference input lead the clock signals at the feed-back input in phase, the output up will output a voltage pulse the pulse width of which is directly proportional to the phase lead. When clock signals at the reference input lags the clock signals at the feed-back input in phase, the down output will output a voltage pulse the pulse width of which is directly proportional to the phase lag.

Figure 2:
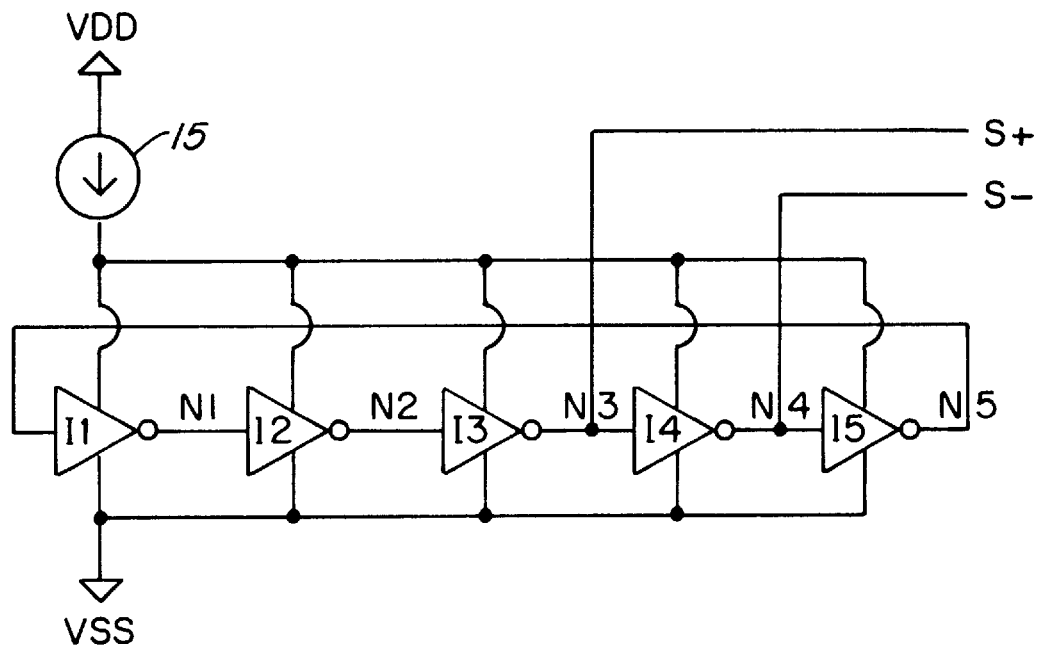

FIG. 2 illustrates a design of a current controlled oscillator which can be used as element 7. A controllable input current source 15 from (voltage to current converter 6) supplies operating current to a ring oscillator, the ring oscillator being comprised of a series of inverters I1–I5 in this example. This circuit generates a reduced swing clock signal in the output nodes N1–N5 of each of the five oscillating elements. The frequency of each clock signal is identical in symmetry, and is given, for example, by the reciprocal of ten times the oscillating element propagation delay, which is a function of the current supplied from the current source 15.

In a laboratory prototype, because there were five identical inverters in the ring, each inverter output a reduced swing clock signal the phase of which led the output of the following inverter by 216 degrees.

The magnitude of the reduced-swing clock signal at the output nodes of each inverter is determined by the input current in such a relation that the higher the input current into the ICO, the larger is the oscillator frequency. A logic 0 level of the swing is the system ground value VSS, while the logic 1 level of the swing is limited by the operation of the ICO to a voltage which ranges from the minimum supply voltage for oscillation that can possibly occur among the five inverters or the maximum voltage for the previous voltage to current converter 6 to maintain a constant current into the ICO. Differential outputs are taken from the ICO at nodes N3 and N4, or at the output nodes of any other two consecutive oscillating elements. It may be seen that a differential output signal can be obtained from the output nodes of any serial connected odd number of inverters, for a particular design which requires the delay between the differential output signal components. However, for the present embodiment, the odd number of inverters is 5.

In the present specification, the differential output signals and the nodes at which they appear are labeled S+ and S− respectively. These signals are reduced swing clock signals of which the frequency is determined by the input current level of the ICO 7. In a laboratory prototype, S+ led S− by a phase of 216 degrees.

Figure 3:
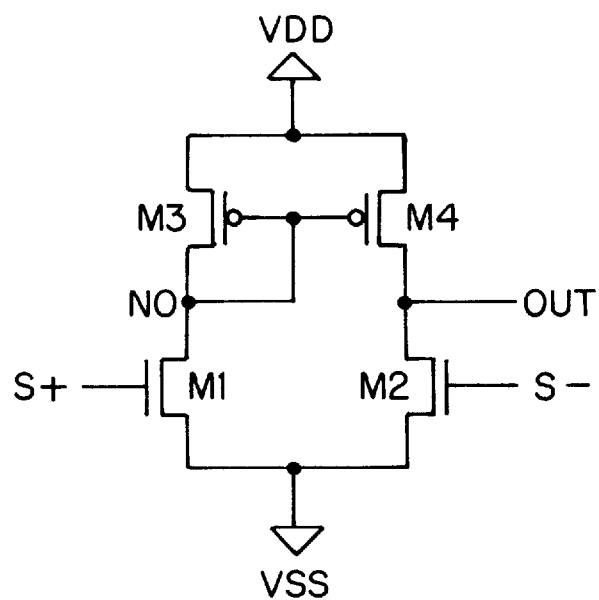

FIG. 3 illustrates a basic level translator which does not have the ability to provide output slew rate control, and thus duty cycle control. A description thereof will be given as background in order to better understand the present invention. The translator (and the improved translator used in the present invention) is preferably fabricated using metal oxide silicon field effect transistors (MOSFETs).

A differential input stage of the level translator is formed of two n-channel MOSFETs, M1 and M2, the gates of which are connected to receive the S+ and S− signals respectively of the current controlled oscillator. The bulks (substrates) and sources of the MOSFETs are connected together and to the system ground VSS. The drain node of MOSFET M1, denoted as N0, is connected to the drain node of MOSFET M3, and is connected to the gates of MOSFETs M3 and M4. MOSFETs M3 and M4 are two p-channel MOSFETs configured as a current mirror, with their substrates and sources connected together and to the power supply VDD. The output signal of the level translator appears at node OUT, which is formed by connecting the drain nodes of MOSFETs M2 and M4.

Figure 4:
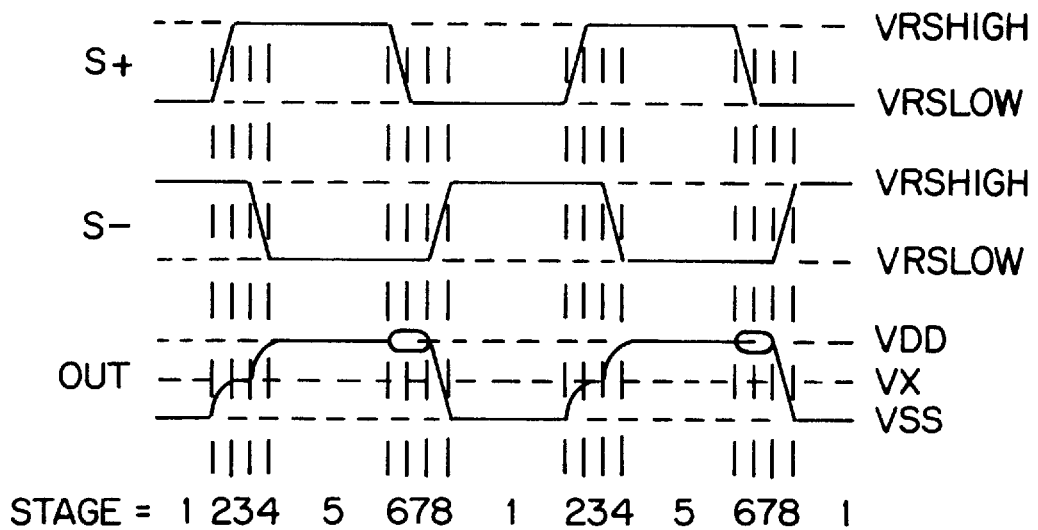

Operation of the level translator will be understood by a consideration of FIG. 4. The operation of the level translator is periodic, since the input signals S+ and S− are periodic. Signal S+ appears at the gate of MOSFET M1, leading signal S− which appears at the gate of MOSFET M2 by a phase, in the present example, of 216 degrees.

The cycle of the level translator may be viewed as comprising up to eight stages as follows, which are illustrated along a horizontal time line:

Stage 1, when signal S+ is at reduced swing logic 0 voltage VRSLOW and signal S− is at reduced swing logic 1 voltage VRSHIGH;

Stage 2, when signal S+ is rising and signal S− stays at VRSHIGH;

Stage 3, when both signals S+ and signal S− are at VRSHIGH;

Stage 4, when signal S+ is at VRSHIGH and signal S− is falling;

Stage 5, when signal S+ is at VRSHIGH and signal S− is at VRSLOW;

Stage 6, when signal S+ is falling and signal S− is at VRSLOW;

Stage 7, when both signals S+ and signal S− are at VRSLOW; and

Stage 8, when signal S+ is at VRSLOW and signal S− is rising.

It should be noted that it is possible that the phase relationship between the signals S+ and S− when either or both of stage 3 or stage 7 do not exist. In the above example, if the rise or fall time or both of signals S+ and S− are longer than 36 degrees, the level translator operation cycle may consist of only seven stages if either stage 3 or stage 7 does not exist, or six stages if both stage 3 and stage 7 do not exist.

As a requirement for the ICO to oscillate, the power supply node of each inverter must maintain a voltage higher than both the magnitude of Vtn and Vtp (the thresholds of conduction of an n and p channel MOSFETs respectively). The ground node of each inverter must be maintained at system ground VSS. Therefore VRSLOW will be equivalent to VSS, and VRSHIGH will be higher than both $|v_{tn}|$ and $|v_{tp}|$.

The output signal of the level translator is defined by stages as follows. In stage 1, S+ stays at VRSLOW so that MOSFET M1 is cut off. Then, the drain node N0 of MOSFET M3 is pulled to a voltage equal to one |Vtp| below VDD, so that MOSFET M4 is also cut off. A voltage of VRSHIGH at input S− (the gate of MOSFET M2) turns on MOSFET M2 and pulls the level translator output OUT down to VSS.

In stage 2, S+ is rising from VRSLOW to VRSHIGH and MOSFET M1 is steadily driven out of cutoff and into conduction. MOSFET M3 then mirrors the current flowing through MOSFET M1 into MOSFET M4. The output of level translator OUT is now rising from VSS to a voltage VX which is defined by the ration of the channel resistance of MOSFETs M2 and M4.

In stage 3, if applicable, level translator output remains at VX.

In stage 4, S− begins falling from VFSHIGH to VRSLOW, and MOSFET 2 is steadily driven into cutoff. The output of the level translator then rises to VDD where the rising slew rate is determined by the current level supplied by MOSFET M4. This current is identical to the current flowing through MOSFET M1, owing to the current mirroring by MOSFETs M3 and M4.

In stage 5, S− stays at VRSLOW, so MOSFET M2 is cut off. As S+ remains at VRSHIGH, MOSFET M1 is conducting and the current flowing through MOSFET M is mirrored to the output of MOSFET M4 through the current mirror formed by MOSFETs M3 and M4. The output of the level translator rises and stops at the voltage VDD at which MOSFET M4 has zero potential difference between its drain and source nodes. Thus no more current can flow through MOSFET M4 and to the level translator output.

In stage 6, S+ falls from VRSHIGH to VRSLOW and MOSFET M1 is steadily driven into cutoff. Gate voltage at MOSFETs M3 and M4 then steadily rise to about one |Vtp| down from VDD. As MOSFET M4 approaches cutoff, the output of the level translator is high impedance, and the output voltage remains at VDD because of the finite parasitic capacitance attached to the OUT node.

In stage 7, if applicable, the output of the level translator stays at VDD and remains at high impedance.

In stage 8, S− is rising from VRSLOW to VRSHIGH and MOSFET M2 is steadily driven out of cutoff and into conduction. Since S+ remains at VRSLOW and both MOSFETs M3 and M4 are cut off, output of the level translator starts falling from VDD to VSS because of the pull-down performed by MOSFET M2.

Figure 5:
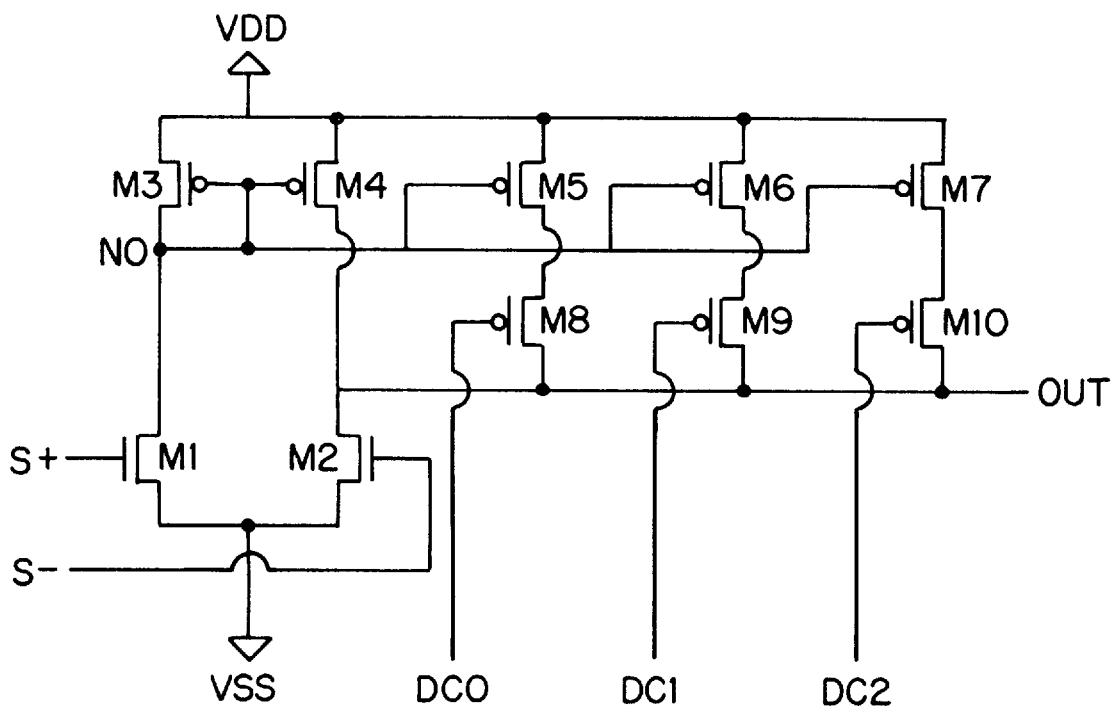

To make the duty cycle of the PLL programmable, the level translator of FIG. 3 is modified as shown in FIG. 5. Six p-channel MOSFETs M5, M6, M7, M8, M9 and M10 are added. Three MOSFETs M5, M6 and M7 form three supplementary branches. Each branch outputs a current level predictably rationed to current flowing through MOSFET M1 via the current mirroring action by MOSFET M3. The sizes of MOSFETs M5, M6 and M7 are preferred to be binary weighted in order to increase the programming span, e.g. the aspect ratio of MOSFET M5 is half that of MOSFET M6, and the aspect ratio of MOSFET M6 is half that of MOSFET M7. Of course more or fewer MOSFETs than those shown may be used to conform to the design desired.

The gates of MOSFETs M5, M6 and M7 are connected in common with the gates of MOSFETs M4 M3, and their substrates and sources are connected together to the system power supply VDD.

The supplementary current provided by the current branches through MOSFETs M5, M6 and M7 are selectively directed to the level translator output node OUT through the three additional MOSFETs M8, M9 and M10, which act as semiconductor switches for the current passing through MOSFETs M5, M6 and M7 respectively. The sources of MOSFETs M8, M9 and M10 are respectively connected to corresponding drains of MOSFETs M5, M6 and M7, and their gates are connected to sources of programming bits DC0, DC1 and DC2. The drains of MOSFETs M8, M9 and M10 are connected together to the level translator OUT node, and their substrates to VDD. The sizes of MOSFETs M8, M9 and M10 may be minimal, but are preferably ratioed in the same way as MOSFETs M5, M6 and M7.

As there is one common gate node for MOSFETs M4, M5, M6 and M7, the level of current supplied through each of the supplementary current branches is determined by the current flowing out of MOSFET M4 multiplied by the transconductance ratios of MOSFETs M5, M6 and M7 respectively to MOSFET M4, assuming all of MOSFETs are in saturation.

The supplementary current branches may be programmed by applying the duty controlling bits DC0, DC1 and DC2 to the gates of MOSFETs M8, M9 and M10, which cause those MOSFETs to source current into or sink current from the output OUT.

There are eight possible levels of supplementary current to supply to the output OUT of the level translator. The effect of the programming occurs during stage 2, stage 3 if applicable, and stage 4 only. In stage 2, the larger the number of supplementary current branches that supply current to the output OUT of the level translator, the faster the output signal can rise to the intermediate voltage VX, as earlier described.

In stage 3, if applicable, the larger the number of supplementary branches that supply current to the output OUT, the lower will be the equivalent channel resistance between OUT and VDD, and the higher the intermediate voltage VX can reach.

In stage 4, the larger the number of supplementary branches that supply current to the output OUT, the faster OUT can rise to VDD.

As a result of the individual effects in stage 2, stage 3 if applicable, and stage 4, the larger the number of supplementary branches that supply current to the output OUT, the faster is the output rise time slew. The output falling interval in stage 8 is not effected by the number of supplementary branches that are supplying current, since the output frequency of the level translator is solely determined by the ICO input current.

A longer high pulse width thus results from more supplementary current branches supplying current to the output OUT of the level translator, since the slew interval of the rise time is shorter. For a fixed synthesized clock frequency, the duty cycle at the output of the level translator output becomes larger.

It should be noted that with MOSFETs M5, M6 and M7 very small in size, there is minimal loading effect on the output current of the level translator, which allows the level translator to operate at very high output frequency, e.g. 200 MHz.

With very light loading of the level translator, a wide range of selectable slew rates can be obtained in stage 2 (and 3 if applicable), and stage 4. This can occupy more than one fifth of an output clock cycle, when programmed using the programming bits described, and with the minimal sizes of the MOSFETs as described.

The mechanism of duty cycle programming described above will be understood to be capable of existing when different frequencies are used, and therefore the invention can provide programmability of the duty cycle at more than one output frequency.

The above-described embodiment of the present invention can be embodied in a frequency synthesizer realized as an integrated circuit. The translator takes the differential outputs from the ICO of the PLL and in the embodiment described, works as a single ended differential gain stage. Output of the level translator is a logic 1 if the ICO positive output which is connected to the level translator positive input is at a higher potential than the ICO negative output which is connected to the level translator negative input, and will be a logic 0 otherwise.

When both outputs from the ICO are at the same potential, the level translator output will either go to high impedance, if the potential at both of the ICO outputs are lower than Vtn, or go to a voltage VX, which is determined by the channel resistance ratio of the p-channel transistor and the n-channel transistor at the output stage of t he level translator, if the potential at both of the ICO outputs are higher than Vtn.

In a successful laboratory prototype, the positive input of the level translator always led the negative input by 216 degrees. Thus a complete cycle of operation involving the level translator consisted of an output logic 1 period of 144 degrees followed by a high impedance output period of 36 degrees, and an output logic 0 period of 144 degrees followed by a period in which the level translator output stays at VX for a period of 36 degrees.

By completing cycle after cycle, the level translator translates the reduced swing differential outputs from the ICO into a single rail-to-rail digital clock signal. The falling edge at the level translator output is controlled by the size of the n-channel transistor acting as a pull-down at the output stage, while the rising edge is determined by the output current of the current mirror formed by two p-channel transistors.

The programming to control the duty cycle of the frequency synthesizer output clock signal is preferably designed in the current mirror section of the level translator, in accordance with the embodiment described, wherein different current mirroring ratios result in different output slew rates of the rising edge at the output, which results in different output duty cycles. However, corresponding circuits may be designed by a person understanding this description to control the slew rate in different parts of the PLL.

The embodiment of the invention described was implemented in the above-described laboratory prototype as follows. The prototype ICO 7, as depicted in FIG. 1, included five CMOS inverters connected as a ring, as depicted in FIG. 2. The oscillation frequency of the inverters ring was controlled by the magnitude of the operating current supplied by the current source 15, as depicted in FIG. 2 (that is the voltage to current converter 7, as depicted in FIG. 1). The ring however may be constructed using any odd number of inverters. Output may be taken from the inverter ring in many ways. Our prototype took different outputs from the ring as depicted in FIG. 2. Other forms of ICO may alternatively be used.

A level translator may be constructed in many ways. The laboratory prototype level translator 8 was constructed by four MOSFETs as shown in FIG. 3. However other forms of level translators may alternatively be used.

The prototype implemented duty-cycle control in the VCO 12, as shown in FIG. 1. However other forms of duty cycle control could alternatively be used in the PLL.

The prototype implemented duty-cycle control in the level translator 8 of the VCO as shown in FIG. 1. The MOSFET implementation of an ordinary level translator is shown in FIG. 3 in the draft. However other forms of duty cycle control in the VCO could be used.

The prototype implemented duty-cycle control using output slew rate control.

A reason for selecting slew rate control inside a level translator is because the output of the level translator is lightly loaded. A slight change in the output current magnitude gives rise to a large output slew rate variation. Thus a wide range of duty-cycle control is possible; meanwhile the synthesized frequency range remains wide.

However slew rate control may be implemented in other ways inside a level translator. The prototype implemented slew rate control using three supplementary output current branches with the current output predictably rationed and binary weighted. The MOSFET implementation of the level translator with output slew rate control as in the prototype is shown in FIG. 5.

A person understanding this invention may now conceive of alternative structures and embodiments or variations of the above. All of those which fall within the scope of the claims appended hereto are considered to be part of the present invention.

We claim:

1. A programmable frequency synthesizer comprising:
   (a) a phase locked loop (PLL) including a current controlled oscillator (ICO),
   (b) a level translator for receiving output signals from the ICO wherein the output signals have a finite slew rate,
   (c) a reference source of signals,
   (d) a phase-frequency detector for receiving signals from said reference source and output signals generated by the level translator and for providing pulse signals to the ICO having pulse widths which are directly proportional to phase difference between the signals from the reference source and the output signals from the level translator, and
   (e) means for varying the slew rate of the output signals from the ICO wherein the duty cycle and thus the frequency of output signals of the level translator may be varied.

2. A programmable frequency synthesizer as defined in claim 1 wherein the level translator is comprised of a current mirror for receiving the output signals from the ICO and wherein the means for varying the slew rate is comprised of means for selectively varying a reflected amount of output current of the current mirror to an output terminal of the level translator for providing said output signals from the level translator.

3. A programmable frequency synthesizer as defined in claim 2 wherein the current mirror is comprised of input field effect transistors (FETs), an output FET and a mirroring FET, and in which the means for varying is comprised of a plurality of FETs having their gates and sources connected in parallel with the mirroring FET and their drains respectively connected in series with the corresponding sources of individual programming FETs, the drains of the programming FETs being connected together and to said output terminal of the level translator, and programming logic signal inputs connected to respective gates of the programming FETs, whereby selectable ones of the programming FETs may be caused to become conductive and thus become parallel current paths with the output FET of the current mirror.

4. A programmable frequency synthesizer as defined in claim 1 wherein the ICO is comprised of a plurality of inverters connected in series, an output of a final inverter being connected to an input of a first inverter in the series, means for applying variable operating current to the series of inverters whereby the frequency of the ICO can be varied, and means for providing said output signals from the ICO as differential signals from the input of one of the inverters and the output of another inverter spaced an odd number of inverters from said one of the inverters.

5. A programmable frequency synthesizer as defined in claim 4 in which the odd number of inverters is one.

6. A programmable frequency synthesizer as defined in claim 4 wherein the ICO is comprised of a plurality of inverters connected in series, an output of a final inverter being connected to an input of a first inverter in the series, means for applying variable operating current to the series of inverters whereby the frequency of the ICO can be varied, and means for providing said output signals from the ICO as differential signals from the input and output of one of the inverters.

7. A programmable frequency synthesizer comprising:
   (a) a phase locked loop (PLL) including a current controlled oscillator (ICO),
   (b) a reference source of signals,
   (c) a phase-frequency detector,
   (d) a circuit for applying signals from the reference source to an input of the phase frequency detector,
   (e) a circuit for applying signals derived from an output of the PLL to another input of the phase-frequency detector,
   (f) a circuit for providing output signals from the phase-frequency detector to the ICO which are directly proportional to a phase difference between the signals from the reference source and the signals derived from an output of the PLL, and
   (g) means for varying the slew rate of output signals from the ICO wherein the duty cycle of the output signals may be varied.

8. A programmable frequency synthesizer as defined in claim 7 wherein the means for varying is comprised of providing a selectable amount of current derived from the output signals from the ICO to an output terminal for supplying said feedback signals.

9. A programmable frequency synthesizer as defined in claim 8 wherein the means for providing a selectable amount of current is comprised of current switches for carrying said selectable amount of current, having inputs for receiving program signal inputs for enabling and inhibiting said switches.

10. A programmable frequency synthesizer as defined in claim 8 wherein the ICO is comprised of an oscillator, and including means for varying the oscillation rate by varying current derived from an output of the phase-frequency detector, as said signals provided to the ICO.

11. A programmable frequency synthesizer comprising a phase locked loop (PLL) including a current control oscillator (ICO) which generates a digital clock signal, the frequency of which is controlled by input current to the ICO, a level transistor which has a finite output slew rate for translating reduced swing output signals from the ICO into fully digital signals, an output buffer for buffering the output of the level translator, a reference source of clock signals, a phase-frequency detector (PFD) for receiving output signals from said reference source and the output from the output buffer and for generating voltage pulse signals having pulse widths which are directly proportional to phase difference between the signals from the reference source and the output signals from the output of the output buffer, a charge pump for converting output voltage pulses from the PFD into output current pulses, a loop filter for converting output current pulses from the charge pump into a bias voltage and for providing the PLL with high order damping, a voltage to current converter for mapping the output bias voltage from the loop filter into bias current applied to the ICO for control thereof, and apparatus for varying the slew rate of the output signals from the level translator wherein the duty cycle of the output signals may be varied.

12. A programmable frequency synthesizer comprising a phase locked loop (PLL) including a current controlled oscillator (ICO) which has an internal signal with a finite slew rate, a reference source of clock signals, a phase-frequency detector (PFD) for receiving output signals from said reference source and the output from the ICO and for generating voltage pulse signals having pulse widths which are directly proportional to phase difference between the signals form the reference source and the output signals from the output from the ICO, a charge pump for converting output voltage pulses from the PFD into output current pulses, a loop filter for converting output current pulses from the charge pump into a bias voltage and for providing the PLL with high order damping, a voltage to current converter for mapping the output bias voltage from the loop filter into bias current that controls the ICO, and apparatus for varying the slew rate of a signal within the ICO wherein the duty-cycle of the output signals may be varied.

13. A programmable frequency synthesizer comprising a phase locked loop (PLL) including a voltage controlled oscillator (VCO) which has an internal signal with a finite output slew rate, a reference source of clock signals, a phase-frequency detector (PFD) for receiving output signals from said reference source and the output from the VCO and for generating voltage pulse signals having pulse widths which are directly proportional to phase difference between the signals from the reference source and the output signals from the output from the VCO, a charge pump for converting output voltage pulses from the PFD into output current pulses, a loop filter for converting output current pulses from the charge pump into a bias voltage and for providing the PLL with high order damping, a voltage to current converter for mapping the output bias voltage from the loop filter into bias current that controls the ICO, and apparatus for varying the slew rate of a signal within the VCO wherein the duty-cycle of the output signals may be varied.

14. A method of synthesizing a signal comprising providing a phase locked loop having a current controlled oscillator (ICO), selectively varying the slew rate of an output signal of the ICO to thereby vary the duty cycle thereof, the selectively varying step including selecting an amount of current derived from the output signal of the ICO and providing the selected amount of current to a feedback loop of the phase locked loop, the selectively varying step is comprised of switching FETs in parallel to carry said current derived from the output signal, thereby sourcing increased current to the feedback loop when an output voltage of the ICO is rising, or draining increased current from the feedback loop when the output voltage of the ICO is falling.

15. A method of synthesizing a signal comprising synthesizing a pulse signal within a phase locked loop and selectively varying the slew rate of said signal within the phase locked loop vary the duty cycle of said signal, the phase locked loop including a voltage controlled oscillator (VCO) and means for varying the slew rate of a signal within the VCO.

* * * * *